US012641787B2

(12) United States Patent
Shimomura

(10) Patent No.: US 12,641,787 B2
(45) Date of Patent: May 26, 2026

(54) SEMICONDUCTOR MEMORY DEVICE AND METHOD OF MANUFACTURING SEMICONDUCTOR MEMORY DEVICE

(71) Applicant: Kioxia Corporation, Tokyo (JP)

(72) Inventor: Masashi Shimomura, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 1021 days.

(21) Appl. No.: 17/837,459

(22) Filed: Jun. 10, 2022

(65) Prior Publication Data

US 2023/0189523 A1     Jun. 15, 2023

(30) Foreign Application Priority Data

Dec. 13, 2021     (JP) ................................. 2021-201619

(51) Int. Cl.
| | |
|---|---|
| *H10B 43/27* | (2023.01) |
| *H10B 41/27* | (2023.01) |
| *H10W 20/41* | (2026.01) |
| *H10W 20/42* | (2026.01) |

(52) U.S. Cl.
CPC ............. *H10B 43/27* (2023.02); *H10B 41/27* (2023.02); *H10W 20/42* (2026.01); *H10W 20/435* (2026.01)

(58) Field of Classification Search
CPC ..... H01L 23/5226; H10B 43/35; H10B 43/27; H10W 20/42
See application file for complete search history.

(56) References Cited

U.S. PATENT DOCUMENTS

| | | | |
|---|---|---|---|
| 9,905,573 B1 * | 2/2018 | Mada ...................... | H10B 43/40 |
| 10,181,442 B1 * | 1/2019 | Watanabe .............. | H10B 41/41 |
| 2011/0031546 A1 | 2/2011 | Uenaka et al. | |
| 2016/0268264 A1 * | 9/2016 | Hwang .................. | H10B 43/20 |
| 2019/0067310 A1 | 2/2019 | Matsuda | |
| 2019/0252404 A1 | 8/2019 | Kaminaga | |
| 2019/0326166 A1 * | 10/2019 | Nam ...................... | H10B 43/27 |
| 2019/0326316 A1 | 10/2019 | Son et al. | |
| 2020/0411546 A1 | 12/2020 | Son et al. | |
| 2022/0399359 A1 * | 12/2022 | Kim ...................... | H10B 41/27 |

FOREIGN PATENT DOCUMENTS

| | | |
|---|---|---|
| JP | 5121792 B2 | 1/2013 |
| JP | 2019041061 A | 3/2019 |
| JP | 2019192905 A | 10/2019 |

* cited by examiner

*Primary Examiner* — Eric K Ashbahian
(74) *Attorney, Agent, or Firm* — Holtz, Holtz & Volek PC

(57) ABSTRACT

A semiconductor memory device according to an embodiment includes: a stacked body in which a plurality of first conductive layers and a plurality of first insulating layers are stacked alternatively, the stacked body including a staircase portion obtained by processing the plurality of first conductive layers in a staircase pattern; a pillar extending in a stacking direction of the stacked body in the stacked body away from the staircase portion in a first direction intersecting the stacking direction; and a contact disposed in the staircase portion and connected to one first conductive layer out of the plurality of first conductive layers, in which the contact includes a second conductive layer extending from above the staircase portion to the one first conductive layer and integrated with the one first conductive layer.

6 Claims, 8 Drawing Sheets

X DIRECTION

X DIRECTION

X DIRECTION

X DIRECTION

Y DIRECTION          Y DIRECTION          Y DIRECTION

FIG.6A
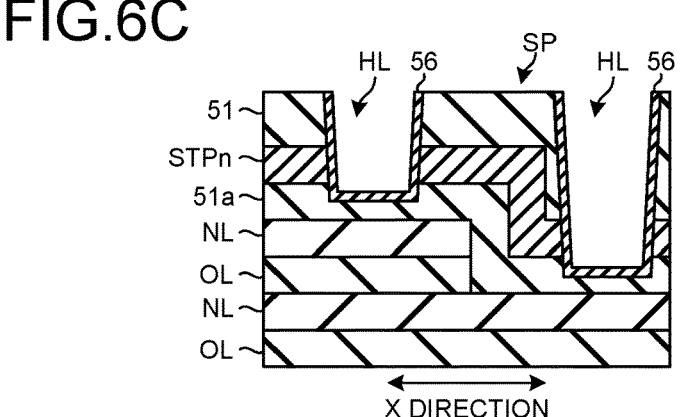
FIG.6B
FIG.6C
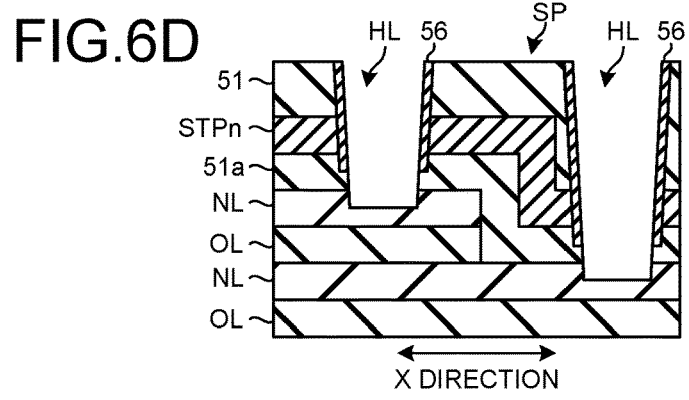
FIG.6D

X DIRECTION

X DIRECTION

X DIRECTION

X DIRECTION

X DIRECTION

X DIRECTION

X DIRECTION

X DIRECTION

X DIRECTION

X DIRECTION

X DIRECTION

X DIRECTION

SEMICONDUCTOR MEMORY DEVICE AND METHOD OF MANUFACTURING SEMICONDUCTOR MEMORY DEVICE

CROSS-REFERENCE TO RELATED APPLICATIONS

This application is based upon and claims the benefit of priority from Japanese Patent Application No. 2021-201619, filed on Dec. 13, 2021; the entire contents of which are incorporated herein by reference.

FIELD

Embodiments described herein relate generally to a semiconductor memory device and a method of manufacturing a semiconductor memory device.

BACKGROUND

In three-dimensional nonvolatile memory, for example, memory cells are three-dimensionally arranged in a stacked body including a plurality of conductive layers as stacked layers. In addition, by processing the plurality of conductive layers in a staircase pattern and connecting a contact to each of the conductive layers, the plurality of conductive layers can be electrically drawn.

BRIEF DESCRIPTION OF THE DRAWINGS

FIGS. 6A to 6D are cross-sectional views sequentially illustrating an example of a part of a procedure in a semiconductor memory device manufacturing method according to the embodiment;

DETAILED DESCRIPTION

A semiconductor memory device according to an embodiment includes: a stacked body in which a plurality of first conductive layers and a plurality of first insulating layers are stacked alternatively, the stacked body including a staircase portion obtained by processing the plurality of first conductive layers in a staircase pattern; a pillar extending in a stacking direction of the stacked body in the stacked body away from the staircase portion in a first direction intersecting the stacking direction, the pillar forming a memory cell at an intersection with at least a part of each of the plurality of first conductive layers; and a contact disposed in the staircase portion and connected to one first conductive layer out of the plurality of first conductive layers, in which the contact includes a second conductive layer extending from above the staircase portion to the one first conductive layer and integrated with the one first conductive layer.

Hereinafter, the present invention will be described in detail with reference to the drawings. The present invention is not limited to the following embodiments. In addition, constituent elements in the following embodiments include those that can be easily assumed by those skilled in the art or those that are substantially identical.

(Configuration Example of Semiconductor Memory Device)

Figures 1A, 1B, 1C, 1D, 1E:
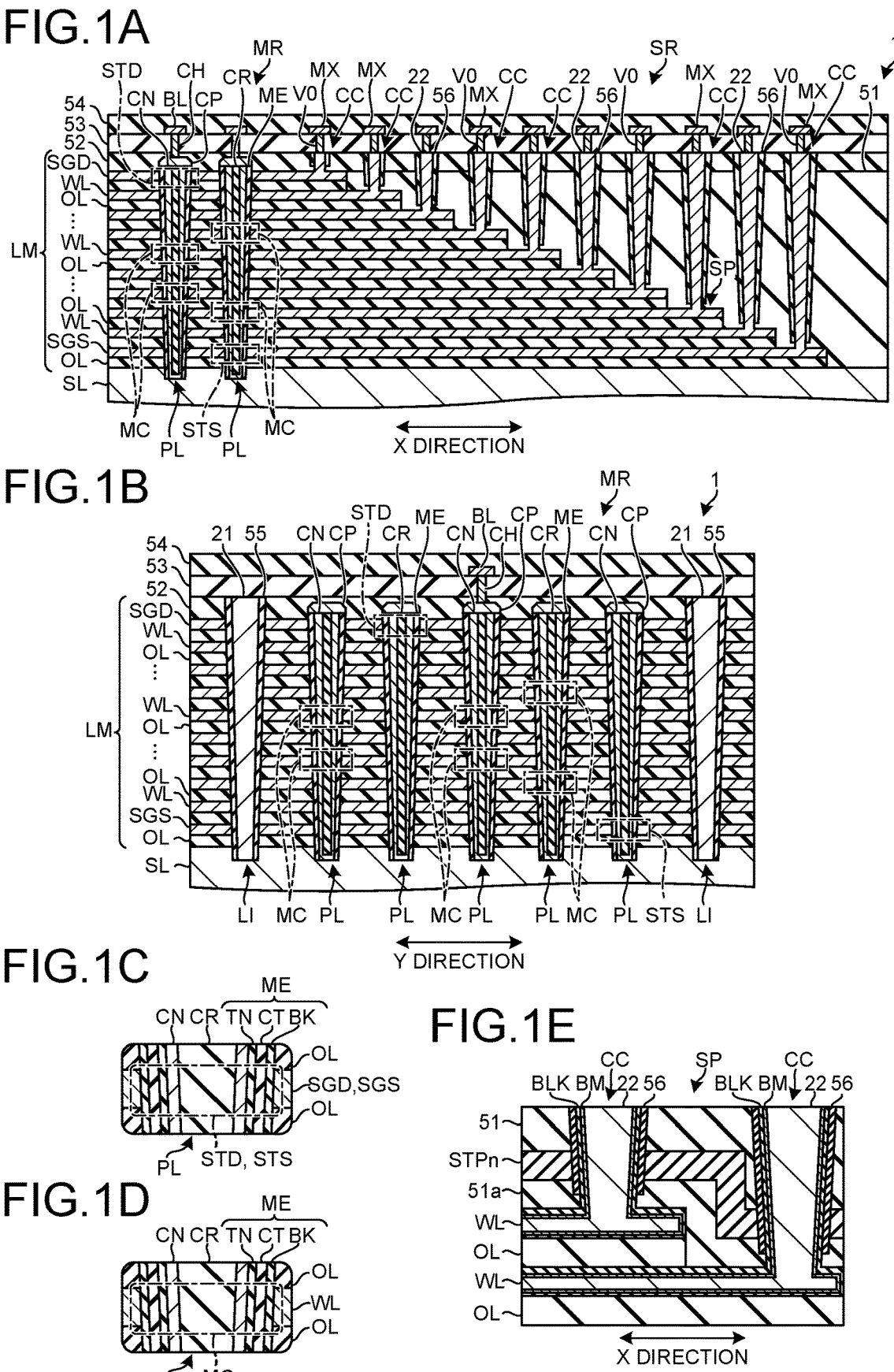
FIGS. 1A to 1E are cross-sectional views illustrating an example of a configuration of a semiconductor memory device according to an embodiment.

FIGS. 1A to 1E are cross-sectional views illustrating an example of a configuration of a semiconductor memory device 1 according to the embodiment. FIG. 1A is a cross-sectional view in the X direction including a memory region MR and a staircase region SR of the semiconductor memory device 1. FIG. 1B is a cross-sectional view in the Y direction including the memory region MR of the semiconductor memory device 1.

FIGS. 1C and 1D are partially enlarged cross-sectional views of pillars PL of the semiconductor memory device 1. Specifically, FIG. 1C is an enlarged view of the pillars PL at the height positions of select gate lines SGD and SGS, and FIG. 1D is an enlarged view of the pillars PL at the height position of a certain word line WL.

FIG. 1E is a partially enlarged cross-sectional view of a staircase portion SP of the semiconductor memory device 1 in the X direction.

In the present specification, both the X direction and the Y direction are directions running in a direction of a surface of the word line WL to be described below, and the X direction and the Y direction are orthogonal to each other. In addition, an electrical drawing direction of the word line WL to be described below may be referred to as a first direction, the first direction being a direction in the X direction. In addition, a direction intersecting the first direction may be referred to as a second direction, the second direction being a direction in the Y direction. However, since the semiconductor memory device 1 may include a manufacturing error, the first direction and the second direction are not necessarily orthogonal to each other.

As illustrated in FIGS. 1A and 1B, the semiconductor memory device 1 includes a source line SL, a stacked body LM, insulating layers 51 to 53, plugs CH and V0, a bit line BL, and upper layer wiring MX. In the present specification, a direction toward the source line SL on the source side is defined as a downward or lower direction of the semiconductor memory device 1, while a direction toward the bit line BL on the drain side is defined as an upward or upper direction of the semiconductor memory device 1.

The source line SL is formed as a conductive polysilicon layer, for example. Alternatively, the source line SL may be a part of a semiconductor substrate such as a silicon substrate. In this case, the source line SL may be a conductive layer in which the dopant is diffused in a surface layer of the semiconductor substrate.

The stacked body LM is arranged on the source line SL. On the stacked body LM, insulating layer 52 to 54 formed as layers such as silicon oxide layers are stacked in this order.

The stacked body LM has a configuration in which a plurality of the word lines WL, select gate lines SGD and SGS, and a plurality of the insulating layers OL are stacked as alternating layers. One or more select gate lines SGD are disposed above the uppermost word line WL, while one or more select gate lines SGS are disposed below the lowermost word line WL.

The word lines WL being the plurality of first conductive layers and the select gate lines SGD and SGS being the plurality of conductive layers are formed as tungsten layers or molybdenum layers, for example. The insulating layers OL being the plurality of first insulating layers are formed as silicon oxide layers, for example.

In the example of FIGS. 1A and 1B, the stacked body LM includes eight word lines WL. In addition, the stacked body LM includes one select gate line SGD and one select gate line SGS. Note that the number of layers of the word line WL and the select gate lines SGD and SGS may be any number, not limited to the examples of FIGS. 1A and 1B.

The stacked body LM is provided with: a memory region MR in which a plurality of pillars PL is disposed; and a staircase region SR including a staircase portion SP in which a plurality of word lines WL and the like are processed in a staircase pattern.

The plurality of pillars PL has a cross-sectional shape, for example, a circular shape, an elliptical shape, or an oval shape when viewed in the stacking direction of the stacked body LM, and is arranged in the memory region MR in a staggered pattern.

Each of the pillars PL penetrates the stacked body LM and reaches the source line SL. In addition, the pillar PL includes a memory layer ME and a channel layer CN in order from the outer peripheral side of the pillar PL. The channel layer CN is also disposed on the bottom surface of the pillar PL. The channel layer CN is filled with a core layer CR. There is provided a cap layer CP disposed in the insulating layer 52 on the channel layer CN.

As illustrated in FIGS. 1C and 1D, the memory layer ME has a stacked structure in which a block insulating layer BK, a charge storage layer CT, and a tunnel insulating layer TN are stacked in this order from the outer peripheral side of the pillar PL. As described above, the pillar PL has a cross-sectional shape such as a circular shape, and has substantially the same shape as viewed in any cross section in the X direction, the Y direction, or the like. Therefore, the cross-sectional direction is not illustrated in FIG. 1C or 1D.

The block insulating layer BK, the tunnel insulating layer TN, and the core layer CR are formed as silicon oxide layers, for example. The charge storage layer CT is formed as a silicon nitride layer, for example. The channel layer CN and the cap layer CP are semiconductor layers such as a polysilicon layer or an amorphous silicon layer.

With such a layer structure, the lower end of the channel layer CN is electrically connected to the source line SL, while the upper end of the channel layer CN is electrically connected to the cap layer CP. The cap layer CP is electrically connected to the bit line BL disposed in the insulating layer 52 via a plug CH disposed in the insulating layers 53 and 54.

As illustrated in FIG. 1D, memory cells MC are formed at intersections of the pillars PL and the plurality of word lines WL, individually. When a predetermined voltage is applied via the word line WL, data is written to and read from the memory cell MC. In this manner, the semiconductor memory device 1 is configured as three-dimensional nonvolatile memory in which the memory cells MC are three-dimensionally arranged, for example.

As illustrated in FIG. 1C, select gates STD and STS are formed at intersections of the pillars PL and the select gate lines SGD and SGS, respectively. When a predetermined voltage is applied via the select gate lines SGD and SGS, the select gates STD and STS are turned on or off to bring the memory cells MC of the pillars PL to which the select gates STD and STS belong into either a selected state or a non-selected state.

As illustrated in FIG. 1A, the staircase region SR is disposed at one end or both ends on one side of the stacked body LM in the X direction, for example. The staircase region SR includes a staircase portion SP in which individual layers of the stacked body LM, such as the word line WL, the select gate lines SGD and SGS, and the insulating layer OL, are processed in a staircase pattern. In other words, one end portion or both end portions on one side of the stacked body LM in the X direction are terminated by individual layers of the stacked body LM processed in a staircase pattern.

The staircase portion SP is covered with an insulating layer 51 such as a silicon oxide layer. The insulating layer 51 being the second insulating layer reaches at least the height of the uppermost layer of the stacked body LM. The insulating layers 52 to 54 covering the stacked body LM also cover the insulating layer 51 on the staircase portion SP.

The staircase portion SP has a plurality of contacts CC penetrating the insulating layers 52 and 51 and connected to the plurality of word lines WL and the select gate lines SGD and SGS. Each of the contacts CC includes a liner layer 56 and a conductive layer 22.

The liner layer 56 being a fourth insulating layer is formed as a silicon oxide layer or the like, for example, and is disposed on a side wall portion of the contact CC. The conductive layer 22 as the second conductive layer is filled inside the liner layer 56. The conductive layer 22 is formed as a tungsten layer, a molybdenum layer, or the like, similarly to the word line WL or the like as a connection target of the contact CC.

The lower end of the conductive layer 22 is electrically connected to the word line WL or the select gate lines SGD and SGS, as a connection target. The upper end of the conductive layer 22 is electrically connected to the upper layer wiring MX disposed in the insulating layer 53, via a plug V0 disposed in the insulating layer 54.

The upper layer wiring MX is electrically connected to a peripheral circuit (not illustrated). The peripheral circuit includes a transistor (not illustrated) and the like. By applying a predetermined voltage to the memory cell MC and the select gates STD and STS via the upper layer wiring MX, the plug V0, the word line WL, the select gate lines SGD and SGS, and the like, the peripheral circuit contributes to the operations of the memory cell MC and the select gates STD and STS.

Here, a detailed configuration of the word line WL, the contact CC, and the like in the staircase portion SP is illustrated in FIG. 1E.

As illustrated in FIG. 1E, an insulating layer STPn is disposed along the shape of the staircase portion SP in the insulating layer 51 covering the staircase portion SP. The insulating layer STPn being a first layer is formed as a silicon nitride layer or the like, for example, and is disposed above the staircase portion SP via an insulating layer 51a which is a part of the insulating layer 51. Note that the insulating layer STPn does not have to be an electrical insulation in case the insulating layer STPn does not contact with any other conductive structure. In that case, instead of the silicon nitride layer, for example, a polysilicon layer or the like may be used.

The conductive layer 22 of the contact CC penetrates the insulating layer 51 above the insulating layer STPn, the insulating layer STPn, and the insulating layer 51*a* which is the insulating layer 51 below the insulating layer STPn, and reaches the word line WL as a connection target, for example. The liner layer 56 of the contact CC reaches at least the insulating layer 51*a* below the insulating layer STPn from the upper end of the contact CC located on the upper surface side of the insulating layer 52. Note that the liner layer 56 may penetrate the insulating layer 51*a* similarly to the conductive layer 22.

There are a barrier metal layer BM and a block layer BLK interposed between the conductive layer 22 of the contact CC and the liner layer 56 in this order from the conductive layer 22 side.

The barrier metal layer BM being a third conductive layer is formed as a titanium layer, a titanium nitride layer, a tantalum layer, or a tantalum nitride layer, for example, and covers the side wall of the conductive layer 22 inside the liner layer 56 and the block layer BLK.

More specifically, the barrier metal layer BM penetrates the insulating layer 51 above the insulating layer STPn, the insulating layer STPn, and the insulating layer 51*a* which is the insulating layer 51 below the insulating layer STPn in a direction from the upper end of the contact CC located on the upper surface side of the insulating layer 52.

In addition, the barrier metal layer BM further extends from the side wall side of the conductive layer 22 continuously to the upper surface of the word line WL to which the contact CC is connected. More specifically, the barrier metal layer BM covers the entire word line WL except for a connection surface with the contact CC on the upper surface of the word line WL. That is, the barrier metal layer BM covers the upper surface, the end surface terminating in a staircase pattern, and the lower surface of the word line WL continuously from the side wall side of the conductive layer 22.

The block layer BLK being a metal-containing insulating layer is formed as an aluminum oxide layer or the like, for example, and covers the side wall of the conductive layer 22 via the barrier metal layer BM inside the liner layer 56.

More specifically, the block layer BLK penetrates the insulating layer 51 above the insulating layer STPn, the insulating layer STPn, and the insulating layer 51*a* which is the insulating layer 51 below the insulating layer STPn in a direction from the upper end of the contact CC located on the upper surface side of the insulating layer 52.

In addition, the block layer BLK further extends from the side wall side of the conductive layer 22 continuously to the upper surface of the word line WL to which the contact CC is connected. More specifically, the block layer BLK covers the entire word line WL except for the connection surface with the contact CC on the upper surface of the word line WL via the barrier metal layer BM. That is, the block layer BLK covers the upper surface, the end surface terminating in a staircase pattern, and the lower surface of the word line WL continuously from the side wall side of the conductive layer 22 via the barrier metal layer BM.

Here, neither the barrier metal layer BM nor the block layer BLK is interposed on a connection surface between the conductive layer 22 of the contact CC and the word line WL as a connection target. In addition, there is no trace indicating that the conductive layer 22 and the word line WL are joined, an interface between the conductive layer 22 and the word line WL, or the like on the connection surface between the conductive layer 22 and the word line WL.

In this manner, the conductive layer 22 of the contact CC is integrated with the word line WL as a connection target.

Although FIG. 1E illustrates an enlarged view of a certain word line WL portion, the connection structure with the contact CC is similar to that of the word line WL portion also in the select gate lines SGD and SGS portions.

That is, the contact CC connected to the select gate lines SGD and SGS includes the conductive layer 22 integrated with the select gate lines SGD and SGS, respectively. That is, between the conductive layer 22 and the select gate lines SGD and SGS, there is no trace, interface, or the like indicating that these portions have been joined to each other.

In addition, these contacts CC each include the barrier metal layer BM that continuously covers the side wall of the conductive layer 22 and the entire select gate lines SGD and SGS. In addition, these contacts CC include the block layer BLK that continuously covers the side wall of the conductive layer 22 and the entire select gate lines SGD and SGS outside the barrier metal layer BM.

In addition, each of these contacts CC includes the liner layer 56 individually covering the side wall of the conductive layer 22 outside the block layer BLK and reaching at least a depth position in the insulating layer 51*a* below the insulating layer STPn.

As illustrated in FIG. 1B, the stacked body LM is divided in the Y direction by a plurality of plate contacts LI.

Each of the plurality of plate contacts LI extends in the stacked body LM in the stacking direction of each layer of the stacked body LM, and also extends in the direction running in the X direction in a region in the stacked body LM from the memory region MR to the staircase region SR. That is, the plurality of plate contacts LI penetrate the insulating layer 52 and the stacked body LM and reach the source line SL at positions separated from each other in the Y direction.

There is provided an insulating layer 55 such as a silicon oxide layer disposed on a side wall of the plate contact LI. The inside of the insulating layer 55 is filled with a conductive layer 21 such as a tungsten layer. The conductive layer 21 of the plate contact LI is electrically connected to the upper layer wiring by a plug or the like (not illustrated). A lower end of the conductive layer 21 is electrically connected to the source line SL.

With the above configuration, the plate contact LI functions as a source line contact, for example. However, instead of the plate contact LI, an insulating layer or the like not having a function as a source line contact may divide the stacked body LM in the Y direction.

Note that the above-described insulating layer STPn is not disposed near the plate contact LI.

(Semiconductor Memory Device Manufacturing Method)

Next, an example of a method of manufacturing the semiconductor memory device 1 of the embodiment will be described with reference to FIGS. 2A to 8D. FIGS. 2A to 8D are cross-sectional views sequentially illustrating an example of a part of a procedure in a method of manufacturing the semiconductor memory device 1 according to the embodiment.

Figure 2A:
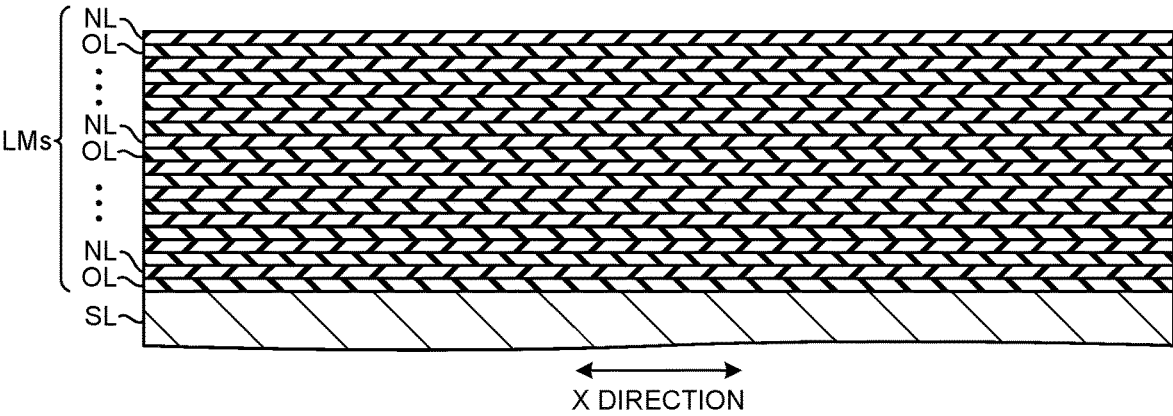
FIGS. 2A to 2C are cross-sectional views sequentially illustrating an example of a part of a procedure in a semiconductor memory device manufacturing method according to the embodiment.
Figure 2B:
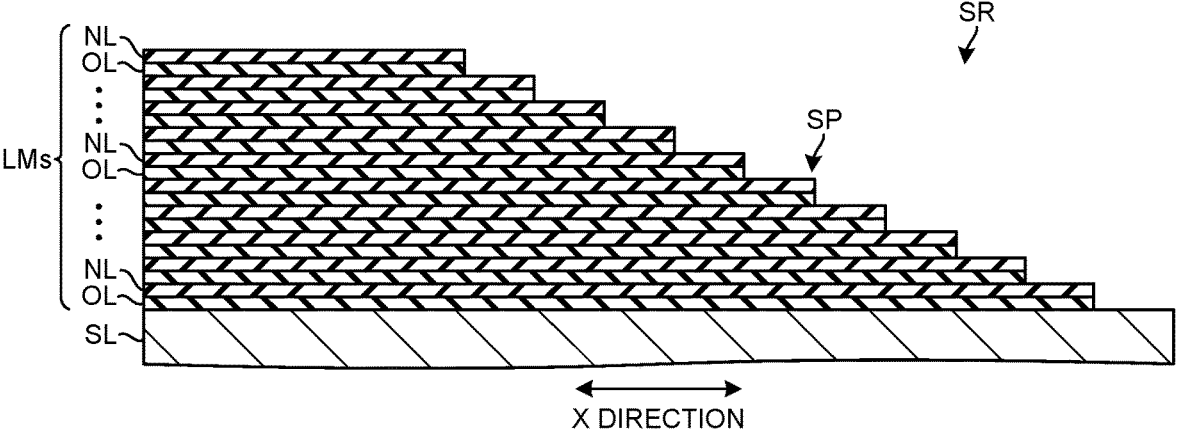
Figure 2C:
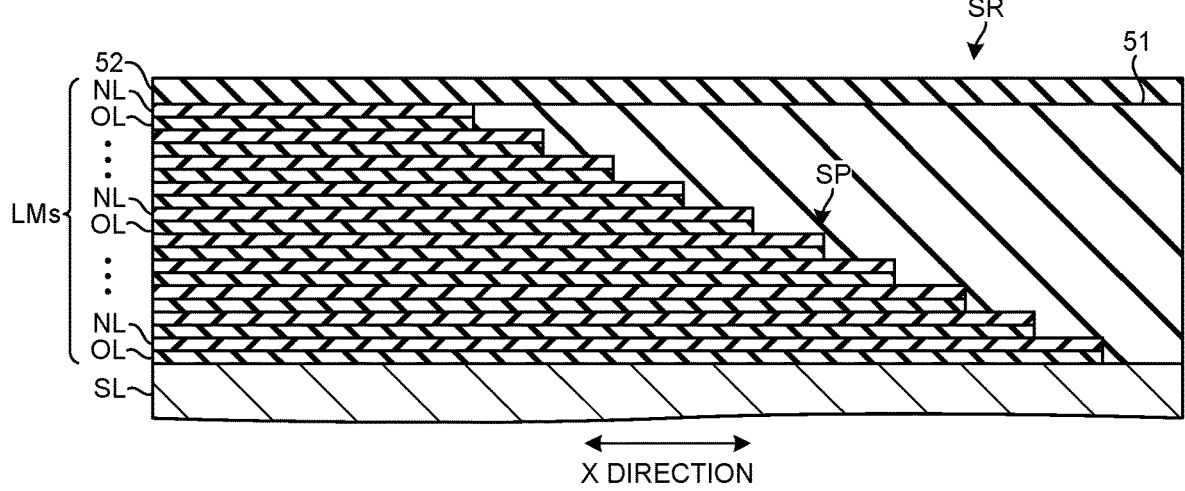

First, FIGS. 2A to 2C illustrate formation processes of the staircase portion SP. FIGS. 2A to 2C are cross-sectional views in the X direction including the staircase region SR in the middle of manufacturing.

As illustrated in FIG. 2A, for example, a conductive polysilicon layer or the like is formed, or a dopant is diffused in a surface layer of a semiconductor substrate to form the source line SL.

In addition, a stacked body LMs being a first stacked body is formed on the source line SL. The stacked body LMs has a configuration in which a plurality of insulating layers NL and a plurality of insulating layers OL are stacked as alternating layers. The insulating layer NL is a sacrificial layer such as a silicon nitride layer. At a later time, the insulating layer NL is replaced with a tungsten layer, a molybdenum layer, or the like, so as to form the word line WL and the select gate lines SGD and SGS. The insulating layer 51 is formed on the stacked body LMs.

As illustrated in FIG. 2B, the insulating layers NL and OL in the stacked body LMs are processed in a staircase pattern to form the staircase portion SP at the end of the stacked body LMs. The staircase portion SP like this is formed by a procedure including forming a mask layer such as a resist layer on the upper surface of the stacked body LMs, slimming the mask layer with oxygen plasma or the like, and repeating process of the insulating layers NL and OL combining one insulating layer NL and one insulating layer OL as a set.

As illustrated in FIG. 2C, the insulating layer 51 is formed so as to cover the staircase portion SP and reach at least the same height as the uppermost layer of the unprocessed portion of the stacked body LMs. At this time, an insulating layer STPn (refer to FIG. 1E) is interposed in the insulating layer 51. Note that the insulating layer STPn is formed so as to avoid a region of the staircase portion SP where the plate contact LI is formed later.

In addition, the insulating layer 52 is formed to cover the unprocessed portion of the stacked body LM and cover the insulating layer 51 on the staircase portion SP. The procedure described above forms, in the stacked body LMs, a configuration of the staircase region SR including the staircase portion SP constituted with the plurality of insulating layers NL and OL.

Next, FIGS. 3A to 5C illustrate formation processes of the pillar PL. FIGS. 3A to 5C are cross-sectional views in the Y direction including a region to be the memory region MR later.

Figures 3A, 3B, 3C:
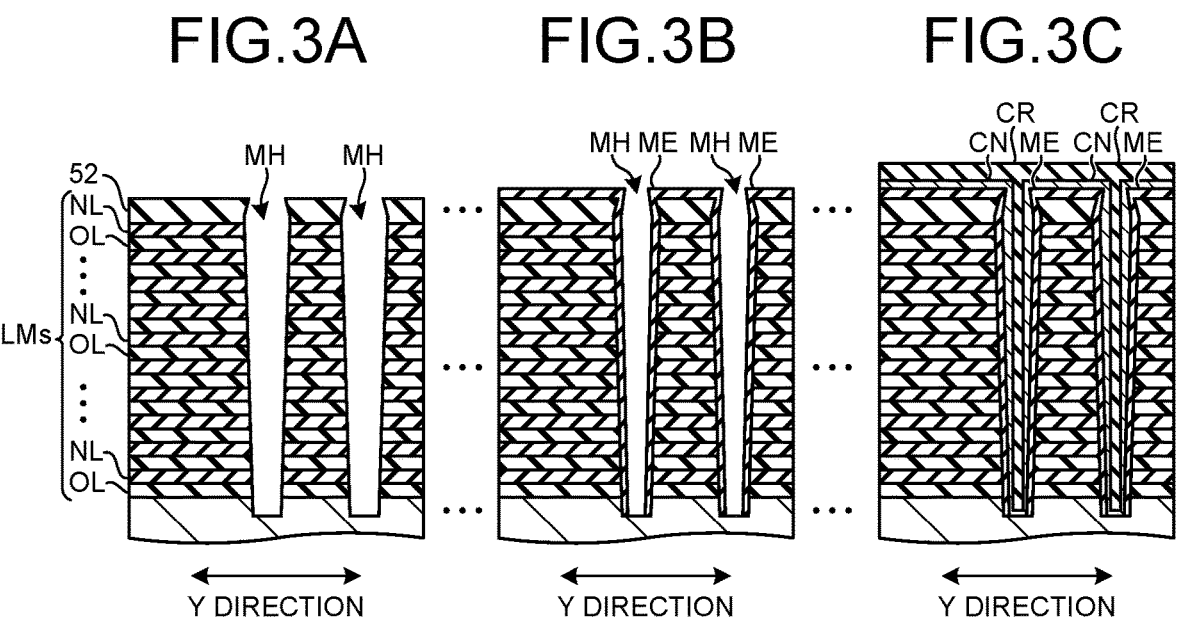
FIGS. 3A to 3C are cross-sectional views sequentially illustrating an example of a part of a procedure in a semiconductor memory device manufacturing method according to the embodiment.

As illustrated in FIG. 3A, a memory hole MH is formed in a region to be the memory region MR later so as to penetrate the insulating layer 52 and the stacked body LMs to reach the source line SL.

As illustrated in FIG. 3B, the memory layer ME is formed to cover the side wall of the memory hole MH. The memory layer ME is formed by stacking a block insulating layer BK, a charge storage layer CT, and a tunnel insulating layer TN in order (FIGS. 1C and 1D). At this time, the memory layer ME is also formed on the upper surface of the insulating layer 52. The memory layer ME is removed from the bottom surface of the memory hole MH.

As illustrated in FIG. 3C, a channel layer CN such as a semiconductor layer is formed to cover the side wall and the bottom surface of the memory hole MH. On the side wall of the memory hole MH, the channel layer CN is formed via the memory layer ME. At this time, the channel layer CN is also formed on the upper surface of the insulating layer 52 via the memory layer ME.

In addition, the core layer CR is filled inside the channel layer CN. At this time, the core layer CR is also formed on the upper surface of the insulating layer 52 via the memory layer ME and the channel layer CN.

Figures 4A, 4B, 4C:
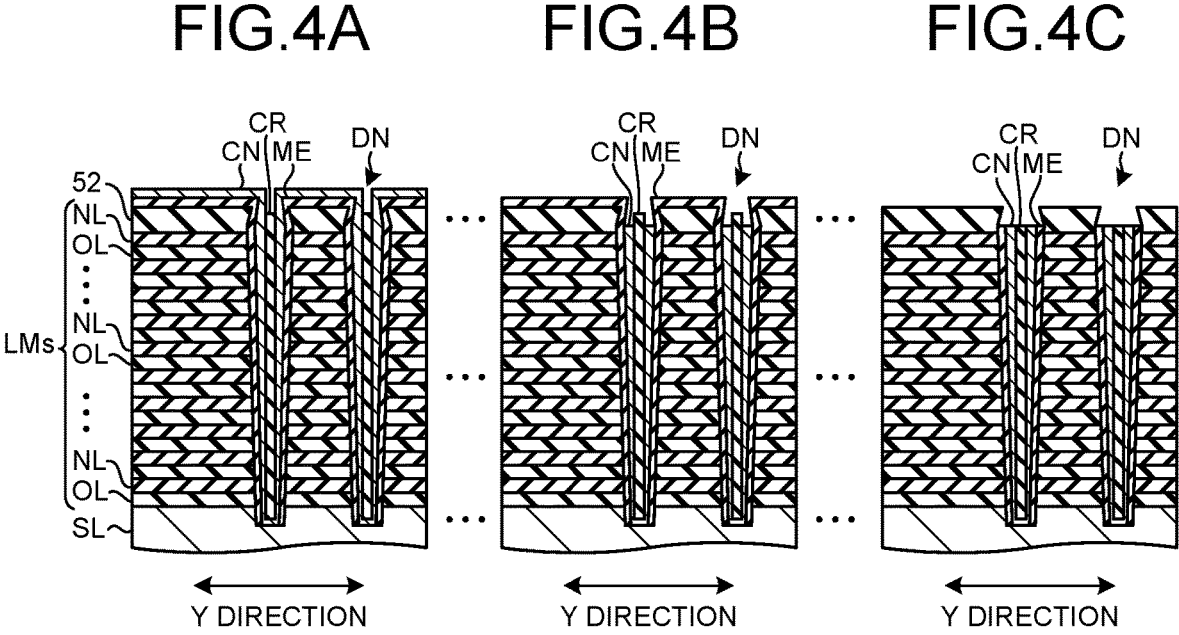
FIGS. 4A to 4C are cross-sectional views sequentially illustrating an example of a part of a procedure in a semiconductor memory device manufacturing method according to the embodiment.

As illustrated in FIG. 4A, etch-back process is performed on the core layer CR. At this time, using the channel layer CN as an etch stopper layer, etch-back process is performed on the core layer CR while maintaining selectivity with respect to the channel layer CN. With this process, the core layer CR is removed from the upper surface of the insulating layer 52 and from the upper end of the memory hole MH, leading to the formation of a recess DN in the memory hole MH.

As illustrated in FIG. 4B, etch-back process is performed on the channel layer CN. At this time, using the memory layer ME as an etch stopper layer, etch-back process is performed on the channel layer CN while maintaining selectivity with respect to the memory layer ME. With this process, the channel layer CN is removed from the upper surface of the insulating layer 52 and from the upper end of the memory hole MH.

On the other hand, the core layer CR is a silicon oxide layer or the like of the same type as the tunnel insulating layer TN or the like included in the memory layer ME. Therefore, the core layer CR protrudes from the upper surface of the channel layer CN dug down in a depth direction in the memory hole MH.

As illustrated in FIG. 4C, an etch-back process is performed on the memory layer ME. With this process, the memory layer ME is removed from the upper surface of the insulating layer 52 and from the upper end of the memory hole MH.

At this time, by performing an etch-back process on the memory layer ME while at least maintaining selectivity with the channel layer CN, it is possible to suppress the removal of the channel layer CN in the memory hole MH. Note that the core layer CR protruding from the upper surface of the channel layer CN also undergoes etch-back process because it is the same type of layer as the tunnel insulating layer TN and the like included in the memory layer ME. This process substantially equalizes the depth positions of individual upper ends of the memory layer ME, the channel layer CN, and the core layer CR in the memory hole MH.

Figures 5A, 5B, 5C:
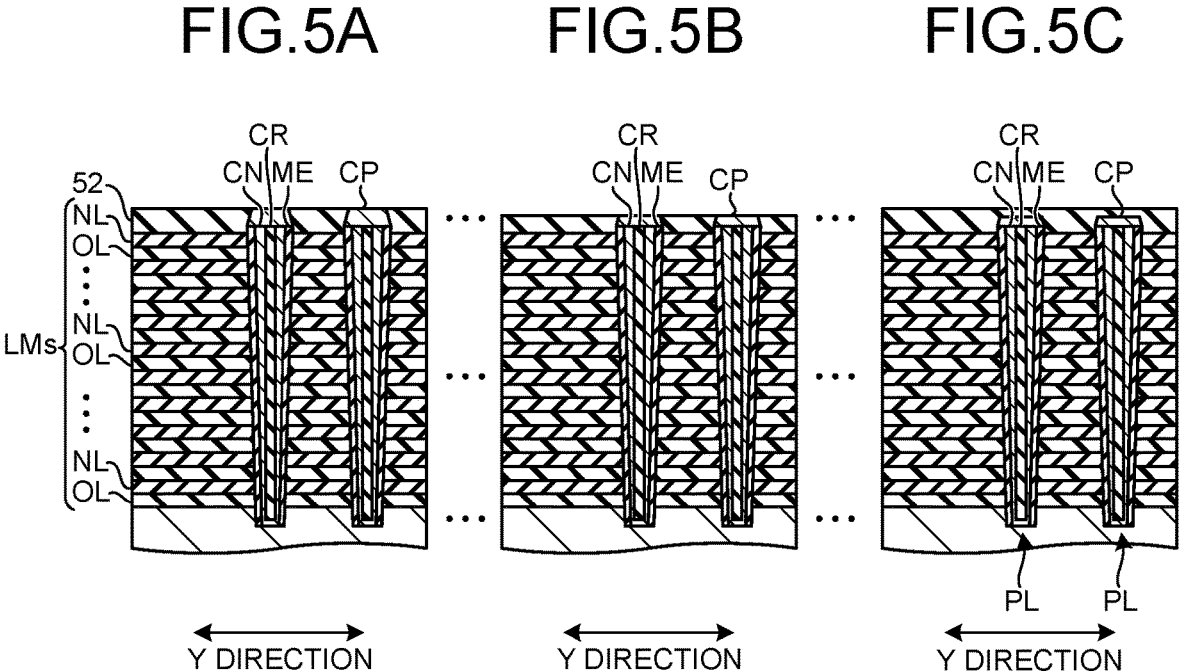
FIGS. 5A to 5C are cross-sectional views sequentially illustrating an example of a part of a procedure in a semiconductor memory device manufacturing method according to the embodiment.

As illustrated in FIG. 5A, the recess DN at the upper end of the memory hole MH is filled with a cap layer CP such as a semiconductor layer.

As illustrated in FIG. 5B, the entire upper surface of the insulating layer 52 undergoes etch-back process together with the upper surface of the cap layer CP. This process decreases the thicknesses of the insulating layer 52 and the cap layer CP.

As illustrated in FIG. 5C, the insulating layer 52 is further stacked. With this process, the cap layer CP is buried in the insulating layer 52. With the above processes, the pillar PL is formed.

Next, FIGS. 6A to 6D illustrate formation processes of a contact hole HL to be a contact CC later. FIGS. 6A to 6D are partially enlarged cross-sectional views of the staircase portion SP in the X direction.

As illustrated in FIGS. 6A to 6D, the insulating layer 51 such as a silicon oxide layer is formed on the staircase portion SP while having an insulating layer STPn such as a silicon nitride layer interposed along the shape of the staircase portion SP.

That is, a thin layer of the insulating layer 51a covering the staircase portion SP is formed below the insulating layer STPn along the staircase shape of the staircase portion SP. The insulating layer STPn covers the staircase portion SP via the insulating layer 51a so as to run along the staircase shape of the staircase portion SP. The insulating layer 51 that covers the staircase portion SP and reaches the height of the uppermost layer of the stacked body LMs is formed on the insulating layer STPn.

As illustrated in FIG. 6A, a contact hole HL is formed to penetrate the insulating layers 52 and 51 above the insulating layer STPn and reach the insulating layer STPn. At this time, using the insulating layer STPn as an etch stopper layer, process such as dry etching is performed on the insulating layer 51 while maintaining selectivity with respect to the insulating layer STPn. With this process, each contact hole HL reaches the insulating layer STPn having different depth positions in the insulating layer 51.

As illustrated in FIG. 6B, process such as dry etching is performed onto the insulating layer STPn to penetrate the insulating layer STPn at the lower end of the contact hole HL. With this process, the individual contact holes HL reach at least different depth positions in the insulating layer 51a below the insulating layer STPn.

At this time, it is preferable that the lower end of the contact hole HL completely penetrates the insulating layer STPn while remaining in the insulating layer 51a without reaching the insulating layer NL. For this purpose, it is preferable to perform dry etching onto the insulating layer STPn while maintaining selectivity with respect to the insulating layer 51a using the insulating layer 51a below the insulating layer STPn as an etch stopper layer.

However, it is sufficient that the contact hole HL does not penetrate the insulating layer NL below the contact hole HL, and for example, the lower end of the contact hole HL may reach the upper surface of the insulating layer NL. Still, it is preferable that the lower end of the contact hole HL has not entered the insulating layer NL.

As illustrated in FIG. 6C, the liner layer 56 such as a silicon oxide layer is formed to cover the side wall and the bottom surface of the contact hole HL. The liner layer 56 is also formed on the upper surface of the insulating layer 52.

As illustrated in FIG. 6D, the liner layer 56 on the bottom surface of the contact hole HL and the insulating layer 51a below the liner layer 56 are removed. The liner layer 56 is removed also from the upper surface of the insulating layer 52. At this time, using the insulating layer NL as an etch stopper layer, process such as dry etching is performed while maintaining selectivity with respect to the insulating layer NL.

In other words, the liner layer 56 is formed by adopting a silicon oxide layer or the like having selectivity in dry etching against the insulating layer NL which is a silicon nitride layer or the like similar to the insulating layer STPn.

This configuration leads to formation of the contact hole HL that penetrates the liner layer 56 on the bottom surface of the contact hole HL and the insulating layer 51a below the insulating layer STPn and reaches the insulating layer NL at mutually different depth positions.

The contact hole HL has a tapered shape, for example, having a diameter decreasing from the upper end toward the lower end. Alternatively, the contact hole HL is formed in a bow shape having a maximum diameter at a predetermined depth between the upper end and the lower end.

In addition, in the vicinity of the lower end of the contact hole HL, the diameter of the contact hole HL may be further narrowed by the thickness of the liner layer 56 in the plane direction of the insulating layer STPn and the like. In this case, the side wall of the contact hole HL may have a step at the reaching position in the insulating layer 51a in the process of FIG. 6C.

However, when the lower end of the contact hole HL has reached the upper surface of the insulating layer NL in the process of FIG. 6B described above, it is only required to remove the liner layer 56 on the bottom surface of the contact hole HL in the process of FIG. 6D, and this makes it possible to expose the insulating layer NL on the bottom surface of the contact hole HL.

In addition, in the process of FIG. 6B described above, when the lower end of the contact hole HL has reached the upper surface of the insulating layer NL, the lower end of the liner layer 56 on the side wall of the contact hole HL should reach the upper surface of the insulating layer NL. In this case, since the insulating layer 51a does not undergo additional etching by the process of FIG. 6D, the side wall of the contact hole HL has no step in the insulating layer 51a, and the diameter of the lower end of the contact hole HL will not be further narrowed.

In the process of FIG. 6B described above, by keeping the lower end of the contact hole HL at least on the upper surface of the insulating layer NL so as not to enter the insulating layer NL, it is possible to suppress protrusion of the liner layer 56 covering the side wall of the contact hole HL into the insulating layer NL. This makes it possible to suppress the lower end of the liner layer 56 that would protrude into the insulating layer NL from hindering the formation of the word line WL to be described below which would cause local thinning of the word line WL or abnormal increase in the electric resistance of the word line WL.

Figures 7A, 7B:
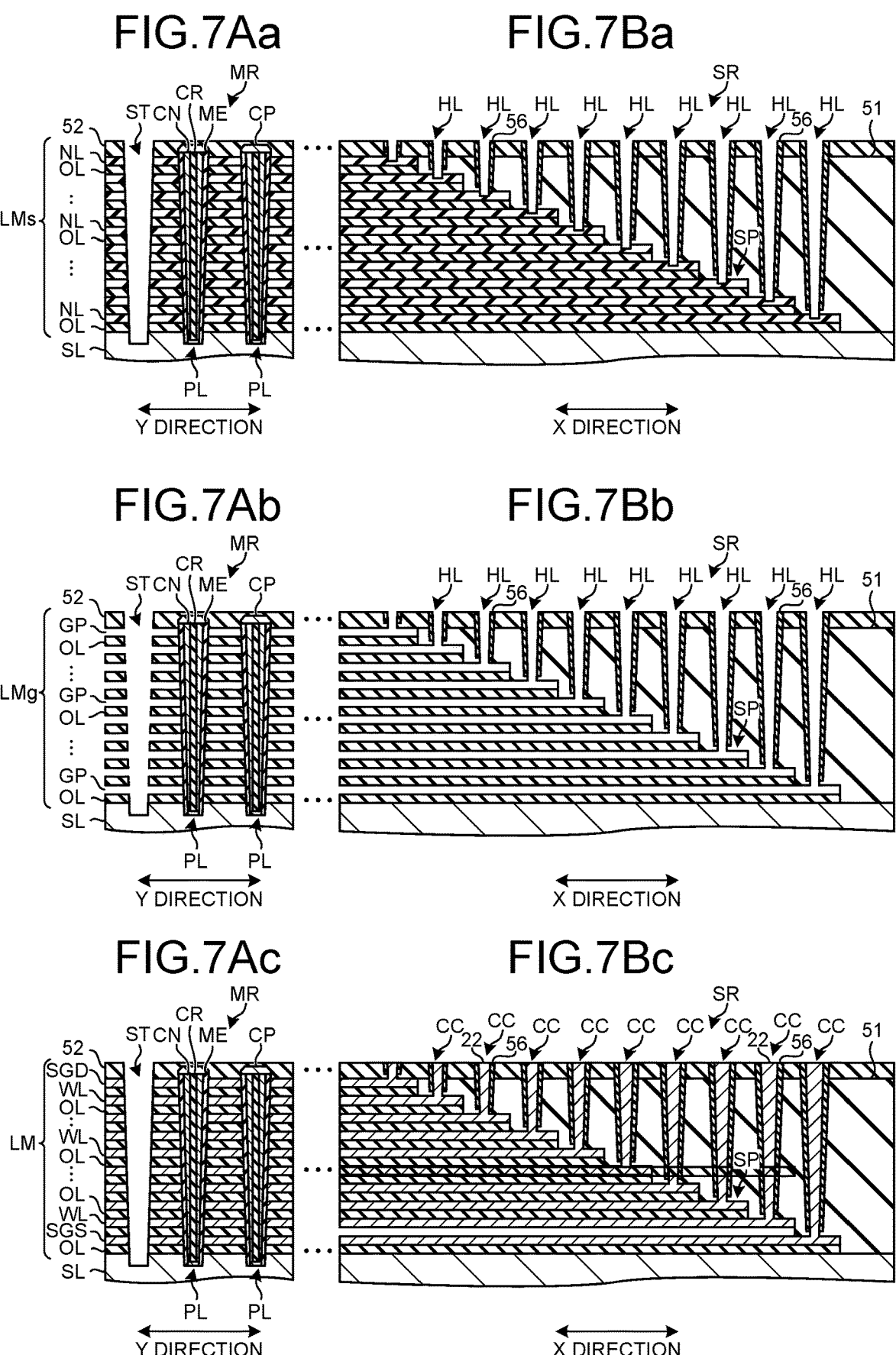
FIGS. 7Aa to 7Bc are cross-sectional views sequentially illustrating an example of a part of a procedure in a semiconductor memory device manufacturing method according to the embodiment.

Next, FIGS. 7Aa to 7Bc illustrate formation processes of the stacked body LM by replacing the plurality of insulating layers NL with a plurality of word lines WL and the like. FIGS. 7Aa to 7Ac are cross-sectional views in the Y direction including the memory region MR, similarly to FIGS. 3A to 5C described above. FIGS. 7Ba to 7Bc are cross-sectional views in the X direction including the staircase region SR, similarly to FIGS. 2A to 2C described above.

As illustrated in FIG. 7Aa, this process forms a plurality of slits ST penetrating the insulating layer 52 and the stacked body LMs and reaching the source line SL. The slit ST also extends in the direction running in the X direction in the stacked body LMs from the memory region MR to the staircase region SR, and is configured to become the plate contact LI later.

As illustrated in FIG. 7Ba, in the staircase region SR, the plurality of contact holes HL penetrating the insulating layers 52 and 51 and the like and reaching each of the plurality of insulating layers NL are formed as illustrated in FIGS. 6A to 6C described above.

As illustrated in FIGS. 7Ab and 7Bb, for example, a chemical liquid such as thermal phosphoric acid is injected into the stacked body LMs through the slit ST and the contact hole HL so as to remove the insulating layer NL in the stacked body LMs.

In the slit ST, the chemical liquid enters from the side wall portion of the slit ST toward the individual insulating layers NL in the stacked body LMs, removing the plurality of insulating layers NL in parallel. On the other hand, in the contact hole HL, the chemical liquid enters from the lower end of each contact hole HL toward the insulating layer NL connected to each contact hole HL, individually removing the plurality of insulating layers NL.

This process removes the plurality of insulating layers NL in the stacked body LMs, leading to the formation of the stacked body LMg as the second stacked body having a gap layer GP between the plurality of insulating layers OL.

As illustrated in FIGS. 7Ac and 7Bc, for example, a source gas or the like of the conductive material is injected into the stacked body LMg through the slit ST and the contact hole HL, so as to fill the plurality of gap layers GP in the stacked body LMg with the conductive material.

In the slit ST, the source gas enters individual gap layers GP in the stacked body LMg from the side wall portion of the slit ST, so as to fill the plurality of gap layers GP with the conductive material in parallel. At this time, a part or the whole of the slit ST may be filled with the conductive material.

On the other hand, in the contact hole HL, the source gas enters the gap layer GP connected to each contact hole HL from the lower end of each contact hole HL, so as to fill the plurality of gap layers GP individually with the conductive material. At this time, the contact hole HL is also filled with the conductive material.

This process forms the stacked body LM being a third stacked body in which the plurality of word lines WL and select gate lines SGD and SGS and the plurality of insulating layers OL are stacked as alternating layers. This also results in formation of the contact CC in which the inside of the liner layer 56 is filled with the conductive layer 22.

In this manner, the plurality of word lines WL and select gate lines SGD and SGS of the stacked body LM and the conductive layer 22 of the contact CC are formed in parallel. This leads to formation of the conductive layer 22 integrated individually with the word line WL and the select gate lines SGD and SGS, without forming an interface or the like between the conductive layer 22 and the word line WL or the select gate lines SGD and SGS.

As illustrated in FIGS. 7Aa to 7Bc, the process of removing the insulating layer NL in the stacked body LMs to form the word line WL and the select gate lines SGD and SGS may be referred to as replacement process.

Here, FIGS. 8A to 8D illustrate more detailed procedures of the replacement process. FIGS. 8A to 8D are partially enlarged cross-sectional views of the staircase portion SP in the X direction, similar to FIG. 6 described above.

Figure 8A:
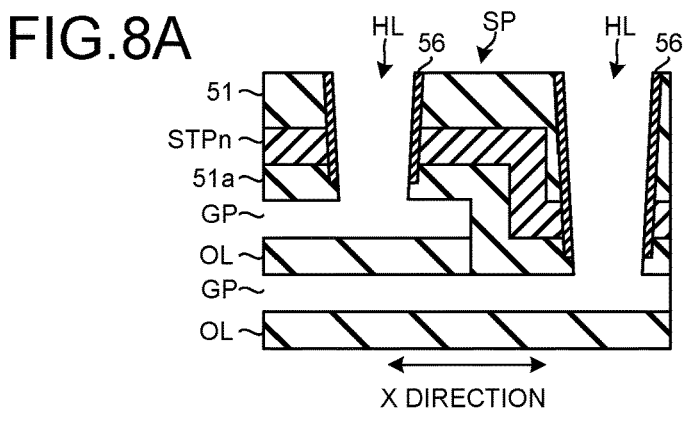
FIGS. 8A to 8D are cross-sectional views sequentially illustrating an example of a part of a procedure in a semiconductor memory device manufacturing method according to the embodiment.

As illustrated in FIG. 8A, also in the staircase portion SP, the plurality of insulating layers NL are removed via the contact hole HL and the slit ST (refer to FIG. 7A).

Note that the insulating layer STPn is formed avoiding the slit ST formation region. That is, the insulating layer STPn is not in contact with the slit ST. In addition, the contact hole HL and the insulating layer STPn are separated from each other by the liner layer 56 on the side wall of the contact hole HL.

For this reason, the chemical liquid is not injected from either the slit ST or the contact hole HL to the side of the insulating layer STPn, leading to no removal of the insulating layer STPn which is the silicon nitride layer or the like of the same type as the insulating layer NL.

Figure 8B:
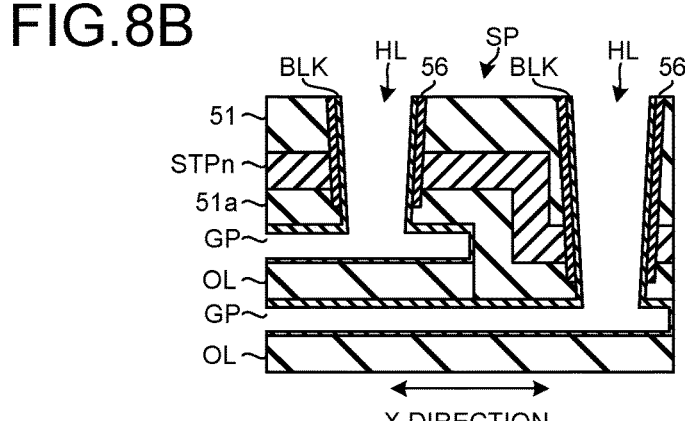

As illustrated in FIG. 8B, for example, a source gas of the block layer BLK or the like is injected through the contact hole HL and the slit ST. This allows formation of the block layer BLK such as an aluminum oxide layer on the side wall of the contact hole HL, the surface of the insulating layer OL facing each other on both sides of the gap layer GP in the stacking direction, and the end surface at the terminal portion of the gap layer GP.

That is, the block layer BLK covers the side wall of the contact hole HL via the liner layer 56 in a portion excluding the lower end of the contact hole HL. The block layer BLK directly covers the side wall of the contact hole HL at the lower end of the contact hole HL. In addition, the block layer BLK continuously extends from the side wall side of the contact hole onto the surfaces of the insulating layers OL facing each other on both sides of the stacked body LMg in the stacking direction across the gap layer GP.

At this time, the block layer BLK is also formed on the end surface of the side wall of the slit ST of the plurality of insulating layers OL.

Figure 8C:
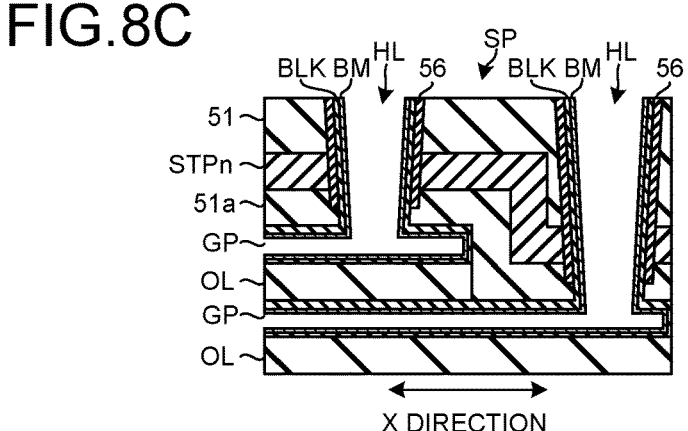

As illustrated in FIG. 8C, for example, a source gas of the barrier metal layer BM or the like is injected through the contact hole HL and the slit ST. This allows formation of the barrier metal layer BM such as a titanium nitride layer via the block layer BLK on the side wall of the contact hole HL, the surface of the insulating layer OL facing each other on both sides of the gap layer GP in the stacking direction, and the end surface at the terminal portion of the gap layer GP.

That is, the barrier metal layer BM covers the side wall of the contact hole HL via the liner layer 56 and the block layer BLK in a portion excluding the lower end of the contact hole HL. The barrier metal layer BM covers the side wall of the contact hole HL via the block layer BLK at the lower end of the contact hole HL. In addition, the barrier metal layer BM continuously extends inside the block layer BLK from the side wall side of the contact hole onto the surfaces of the insulating layers OL facing each other on both sides of the stacked body LMg in the stacking direction across the gap layer GP.

At this time, the barrier metal layer BM is also formed on the end surface of the side wall of the slit ST of the plurality of insulating layers OL via the block layer BLK.

Figure 8D:
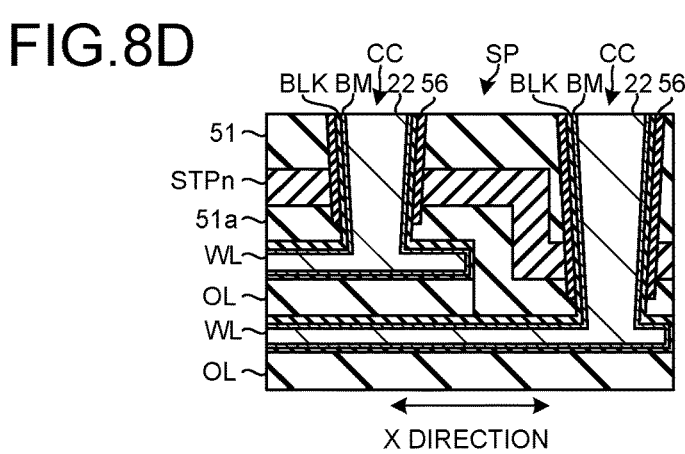

The barrier metal layer BM functions as a seed layer when filling the inside of the contact hole HL and the gap layer GP of the stacked body LMg with a conductive material in the next process illustrated in FIG. 8D.

As illustrated in FIG. 8D, for example, a source gas of a conductive material or the like is injected through the contact hole HL and the slit ST. With this operation, the conductive material is filled inside the barrier metal layer BM in the plurality of gap layers GP in the stacked body LMg, leading to formation of the plurality of word lines WL and the plurality of select gate lines SGD and SGS. In addition, the conductive material is filled inside the barrier metal layer BM in the contact hole HL, leading to formation of the conductive layer 22 integrated with each of the plurality of word lines WL and the select gate lines SGD and SGS.

At this time, a part or the whole of the slit ST is filled with the conductive material. This completes the replacement process.

Thereafter, at least the conductive material and the barrier metal layer BM are removed from the inside of the slit ST. At this time, the block layer BLK may be removed from the inside of the slit ST. Note that the block layer BLK may remain on a part or the entire end surface of the side wall of the slit ST of the plurality of insulating layers OL.

Furthermore, the insulating layer 55 is formed on the side wall of the slit ST, and the conductive layer 21 is formed inside the insulating layer 55. This achieves formation of the plate contact LI functioning as the source line contact.

At this time, the conductive layer 21 of the plate contact LI is insulated from the plurality of word lines WL and the select gate lines SGD and SGS by the insulating layer 55. In addition, since the conductive material and the barrier metal layer BM have been removed from the side wall of the slit ST, it is possible to suppress the influence of the plate contact LI on the electrical characteristics of the plurality of word lines WL and the select gate lines SGD and SGS. The block layer BLK is an insulating layer such as an aluminum oxide layer. Therefore, even when the block layer BLK remains on the side wall of the plate contact LI, the block layer BLK would not have an influence on the electrical characteristics of the plurality of word lines WL or the select gate lines SGD and SGS.

Incidentally, after removal of at least the conductive material and the barrier metal layer BM from the inside of the slit ST, it is allowable to fill the insulating layer in the slit ST without forming the conductive layer 21. In this case, the slit ST filled with the insulating layer will be a structure not contributing to the function of the semiconductor memory device 1, with no function as a source line contact.

In addition, the insulating layer 53 is formed on the insulating layer 52, and the plug V0 penetrating the insulating layer 53 and to be connected to the conductive layer 22 of the contact CC is formed. In addition, the plug CH penetrating the insulating layers 53 and 52 to be connected to the cap layer CP of the pillar PL is formed. In addition, the insulating layer 54 is formed on the insulating layer 53, and the upper layer wiring MX connected to the plug V0 and the bit line BL connected to the plug CH are formed in the insulating layer 54.

The plugs V0 and CH, the upper layer wiring MX, and the bit line BL may be collectively formed using a dual damascene method or the like.

The semiconductor memory device 1 according to the embodiment is manufactured as described above.

SUMMARY

In a semiconductor memory device such as three-dimensional nonvolatile memory, a replacement process is performed via a slit on a stacked body in which a plurality of sacrificial layers and a plurality of insulating layers are stacked as alternating layers to form a stacked body having a plurality of conductive layers. Thereafter, a contact hole reaching each of the plurality of conductive layers in the staircase portion is formed, and the contact hole is filled with the conductive layer to form a contact. This allows the individual conductive layers to be electrically drawn.

However, since the plurality of conductive layers of the stacked body and the conductive layer in the contact are formed in separate processes, the exposed surfaces of the plurality of conductive layers of the stacked body might be oxidized at the bottom surface of the contact hole at the time of forming the contact hole, for example. This might increase the contact resistance of the contact against the plurality of conductive layers of the stacked body.

Furthermore, in recent years, the number of stacked bodies tends to increase in order to increase the storage capacity of the semiconductor memory device. In this case, a staircase length, being a length of the staircase portion in which a plurality of conductive layers are arranged in a staircase pattern, which is a length from the uppermost conductive layer to the lowermost conductive layer, would be extended. For this reason, when the replacement process is performed through the slit, it is difficult to completely fill the conductive material up to the tip end of the staircase portion.

This might leave a cavity portion in the conductive layer of the stacked body, leading to an increase in the wiring resistance of the conductive layer. In addition, the cavity state of the inside of the conductive layer would cause the lower end of the contact hole to penetrate the conductive layer as a connection target and reach the lower conductive layer when the contact hole is formed. This might cause the contact to be connected to a conductive layer that is not a connection target, or cause an occurrence of a short circuit between a plurality of conductive layers of the stacked body.

According to the semiconductor memory device 1 of the embodiment, the contact CC has the conductive layer 22 extending from above the staircase portion SP to one word line WL and integrated with the word line WL. This makes it possible to reduce the contact resistance of the contact CC connected to the plurality of word lines WL and the like.

According to the semiconductor memory device 1 of the embodiment, the liner layer 56 of the contact CC is a layer having selectivity in dry etching against the insulating layer STPn and the insulating layer NL. This makes it possible to form the plurality of contact holes HL having mutually different reach depths while suppressing penetration through the insulating layer NL when penetrating the liner layer 56 on the bottom surface of the contact hole HL and the lower insulating layer 51a.

According to the semiconductor memory device 1 of the embodiment, the barrier metal layer BM of the contact CC continuously extends inside the block layer BLK from the side wall side of the conductive layer 22 to the upper surface of the word line WL as a connection target of the contact CC, which is a surface excluding the connection surface with the contact CC. In this manner, since the barrier metal layer BM and the like are not interposed on the connection surface between the contact CC and the word line WL, the contact resistance of the contact CC can be further reduced.

According to the method of manufacturing the semiconductor memory device 1 of the embodiment, the plurality of insulating layers NL is removed via the slit ST together with the plurality of contact holes HL, and the plurality of gap layers GP is filled with the conductive material via the slit ST together with the plurality of contact holes HL.

This makes it possible to further reliably perform the replacement process of the stacked body LM, achieving sufficient filling of the conductive material up to the tip end portion of the staircase portion SP. This suppresses occurrence of a cavity state of the word line WL or penetration of the contact hole HL through the word line WL and the like as a connection target. This makes it possible to suppress a state in which the contact CC is connected to the word line WL or the like that is not the connection target, or occurrence of a short circuit between the plurality of word lines WL or the like.

According to the method of manufacturing the semiconductor memory device 1 of the embodiment, dry etching using the plurality of insulating layers NL as the etch stopper layers is performed to achieve penetration through the liner layer 56 on the bottom surfaces of the plurality of contact holes HL and the insulating layer 51a below the insulating layer STPn, thereby allowing the plurality of contact holes HL to reach the plurality of insulating layers NL, individually.

In this manner, the liner layer 56 and the insulating layer 51a are removed while obtaining a selection ratio against the insulating layer NL. In other words, by forming the liner layer 56 using a silicon oxide layer or the like having a high selection ratio against the insulating layer NL, for example, it is possible to collectively form the contact holes HL having different reaching depths while suppressing penetration through the insulating layer NL.

Modification

Next, a semiconductor memory device according to a modification of the embodiment will be described with reference to FIGS. 9A to 9H. In the semiconductor memory device of the modification, the liner layer 23 is different in material from the above-described embodiment.

FIGS. 9A to 9H are cross-sectional views sequentially illustrating an example of a part of a procedure in a semiconductor memory device manufacturing method according to a modification of the embodiment. FIGS. 9A to 9H illustrate a cross section in which a part of the staircase portion SP in the X direction is enlarged, illustrating processes corresponding to the above-described processes in FIGS. 6A to 6D and FIGS. 8A to 8D. In FIGS. 9A to 9H, the components similar to those of the semiconductor memory device 1 of the above-described embodiment are denoted by similar reference numerals, and the description thereof may be omitted.

Figure 9A:
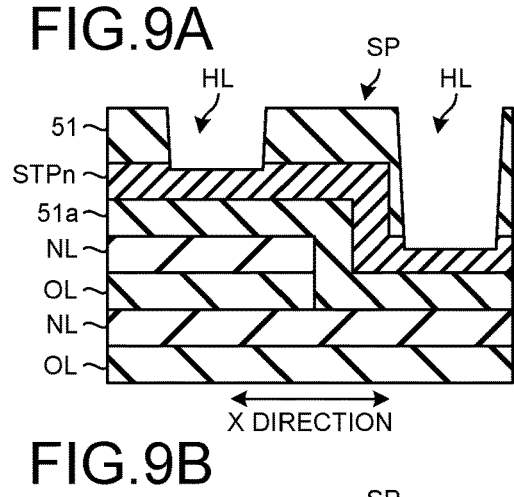
FIGS. 9A to 9H are cross-sectional views sequentially illustrating an example of a part of a procedure in a semiconductor memory device manufacturing method according to a modification of the embodiment.
Figure 9B:
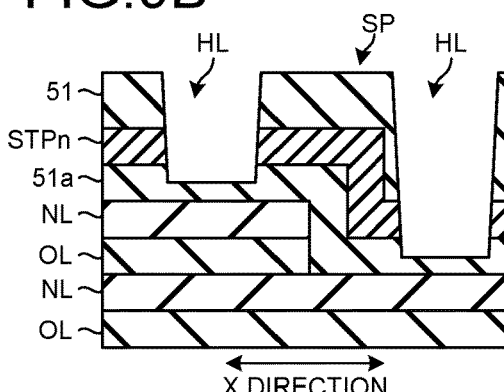

The process illustrated in FIGS. 9A and 9B is similar to the process illustrated in FIGS. 6A and 6B of the above-described embodiment. That is, as illustrated in FIG. 9A, the contact hole HL penetrating the insulating layer 51 above the insulating layer STPn and reaching the insulating layer STPn is formed using the insulating layer STPn as an etch stopper layer. In addition, as illustrated in FIG. 9B, dry etching or the like targeted at the insulating layer STPn is performed to cause the lower end of the contact hole HL to reach a predetermined depth position in the insulating layer 51a.

Figure 9C:
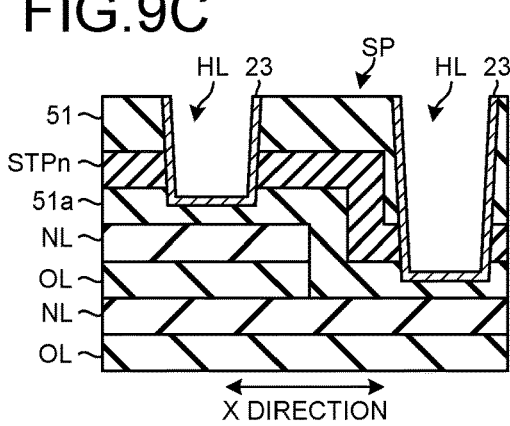

As illustrated in FIG. 9C, the liner layer 23 is formed on the side wall and the bottom surface of the contact hole HL. The liner layer 23 is also formed on the upper surface of the insulating layer 52.

The liner layer 23 as the fourth conductive layer is a conductive layer containing a metal such as a tungsten layer or a molybdenum layer. In this manner, the liner layer 23 containing metal has selectivity in wet etching against the insulating layer 51 a formed as a silicon oxide layer or the like.

Figure 9D:
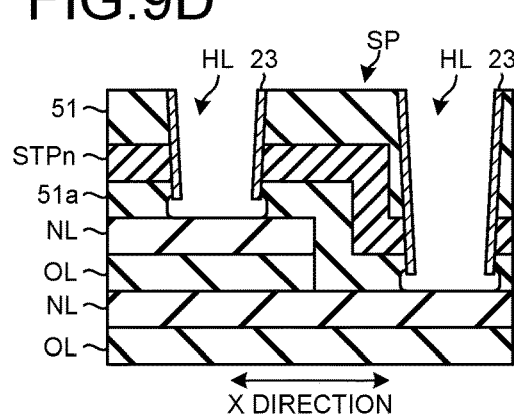

As illustrated in FIG. 9D, the liner layer 23 on the bottom surface of the contact hole HL is removed. At this time, using the insulating layer 51a below the insulating layer STPn as an etch stopper layer, a process such as dry etching is performed while maintaining selectivity against the insulating layer 51a. This process allows the lower end of the contact hole HL to penetrate through the liner layer 23. Note that the liner layer 23 is also removed from the upper surface of the insulating layer 52.

The insulating layer 51a below the liner layer 23 is also removed. At this time, using the insulating layer NL of the stacked body LMs as an etch stopper layer, a process such as wet etching or the like is performed while maintaining selectivity against the insulating layer NL. In the wet etching, the insulating layer 51a is isotropically removed. However, since the side surface of the contact hole HL is covered with the liner layer 23 having selectivity against the insulating layer 51a, it is possible to suppress undesired etching of the insulating layer 51 on the side surface of the contact hole HL.

This configuration leads to formation of the contact hole HL that penetrates the liner layer 23 on the bottom surface of the contact hole HL and the insulating layer 51a below the insulating layer STPn and reaches the insulating layer NL at mutually different depth positions.

Note that isotropic removal of the insulating layer 51a by wet etching causes a shape change in which the diameter of the contact hole HL is slightly expanded at the lower end of the contact hole HL.

Thereafter, the processes illustrated in FIGS. 9E to 9H are similar to the processes illustrated in FIGS. 8A to 8D of the above-described embodiment.

Figure 9E:
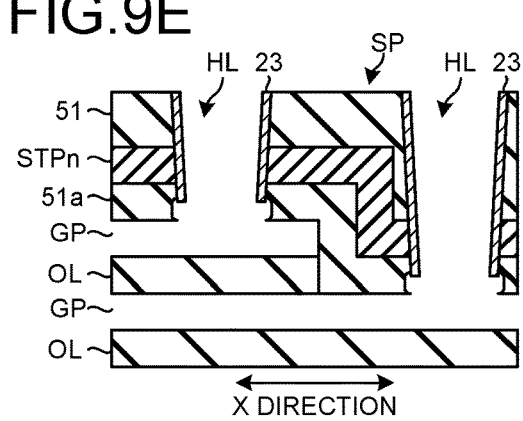

As illustrated in FIG. 9E, the plurality of insulating layers NL is removed through the contact hole HL and the slit ST (refer to FIG. 7A).

As described above, the insulating layer STPn is formed avoiding the slit ST formation region. The contact hole HL and the insulating layer STPn are separated from each other by the liner layer 23 on the side wall of the contact hole HL. The liner layer 23 has resistance to a chemical liquid or the like for removing the insulating layer NL. Therefore, the insulating layer STPn, which is a silicon nitride layer or the like, is not removed.

Figure 9F:
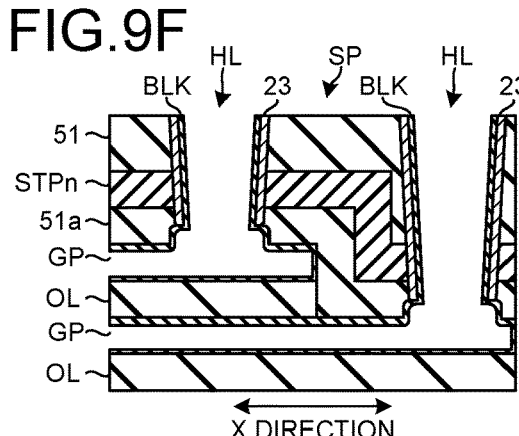

As illustrated in FIG. 9F, for example, a source gas of the block layer BLK or the like is injected through the contact hole HL and the slit ST so as to form the block layer BLK such as an aluminum oxide layer on the side wall of the contact hole HL, the surface of the insulating layer OL facing each other on both sides of the gap layer GP in the stacking direction, and the end surface at the terminal portion of the gap layer GP.

Figure 9G:
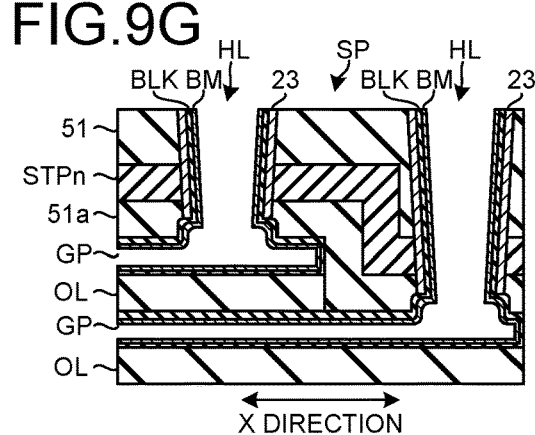

As illustrated in FIG. 9G, for example, a source gas of the barrier metal layer BM or the like is injected through the contact hole HL and the slit ST so as to form the barrier metal layer BM such as a titanium nitride layer is formed through the block layer BLK on the side wall of the contact hole HL, the surface of the insulating layer OL facing each other on both sides in the stacking direction of the gap layer GP, and the end surface at the terminal portion of the gap layer GP.

Figure 9H:
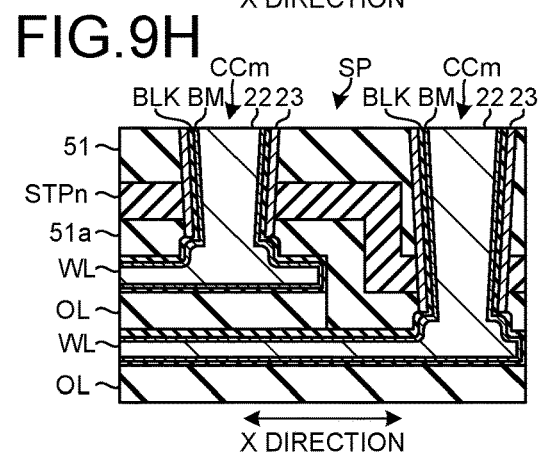

As illustrated in FIG. 9H, for example, a source gas of a conductive material or the like is injected through the contact hole HL and the slit ST to form the conductive layers 22 individually integrated with the plurality of word lines WL and the select gate lines SGD and SGS and integrated with the plurality of word lines WL and the select gate lines SGD and SGS. In addition, the stacked body LM including the plurality of word lines WL and the select gate lines SGD and SGS, together with the contact CCm including the liner layer 23 such as a conductive layer, are formed.

As described above, the semiconductor memory device of the modification is manufactured by the process similar to the process in the semiconductor memory device 1 of the above-described embodiment except for the processes illustrated in FIGS. 9A to 9H.

According to the semiconductor memory device of the modification, the liner layer 23 of the contact CCm is a layer having selectivity against the insulating layer 51a in wet etching. With this configuration, wet etching can be used to form the contact hole HL that penetrates the insulating layer 51a and reaches the insulating layer NL.

In wet etching, it is typically possible to remove the insulating layer 51a which is a silicon oxide layer or the like while maintaining higher selectivity than in dry etching or the like against the insulating layer NL which is a silicon nitride layer or the like. Therefore, in the semiconductor memory device of the modification, it is possible to further reliably suppress penetration of the individual contact holes HL through the insulating layer NL. This makes it possible to further suppress a state in which the contact CCm is connected to the word line WL or the like that is not the connection target, or occurrence of a short circuit between the plurality of word lines WL or the like.

The semiconductor memory device of the modification can achieve other effects similar to those of the semiconductor memory device 1 of the above-described embodiment.

Other Modifications

In the embodiment and the modification described above, the staircase portion SP is disposed at the end of the stacked body LM in the X direction. Alternatively, however, the staircase portion SP in which the plurality of word lines WL and the like are processed in a staircase pattern may be disposed in the central portion of the stacked body LM, for example. In this case, for example, the central portion of the stacked body LM can be processed into a cone shape to function as the staircase portion SP to which the plurality of contacts CC and CCm are connected.

In the above-described embodiment and modification, the insulating layers NL and OL are alternately stacked to form the stacked body LMs. Alternatively, however, the stacked body LMs may be formed in a plurality of tiers, and in that case, the pillar PL and the staircase portion SP may be formed in stages every time the stacked body LMs for one tier is formed. This makes it possible to further increase the number of stacked word lines WL.

In the above-described embodiment and modifications, the semiconductor memory device 1 and the like include the peripheral circuit that contributes to the operation of the memory cell MC. The peripheral circuits may be disposed above, below, or at the same level as the stacked body.

For example, in a case where the above-described source line SL is a part of the semiconductor substrate, the peripheral circuit can be disposed on the semiconductor substrate outside the stacked body LM. In addition, in a case where the source line SL is a polysilicon layer or the like, it is possible to dispose the peripheral circuit below the stacked body LM by forming the peripheral circuit on a semiconductor substrate, covering the circuit with an interlayer insulating layer or the like, and forming the source line SL and the stacked body LM on the interlayer insulating layer.

Alternatively, it is also possible to dispose the peripheral circuit above the stacked body LM by forming the source line SL and the stacked body LM on a support substrate and bonding the semiconductor substrate provided with the peripheral circuit above the stacked body LM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a stacked body in which a plurality of first conductive layers and a plurality of first insulating layers are stacked alternatively, the stacked body including a staircase portion obtained by processing the plurality of first conductive layers in a staircase pattern;
a pillar extending in a stacking direction of the stacked body in the stacked body away from the staircase portion in a first direction intersecting the stacking direction, the pillar forming a memory cell at an intersection with at least a part of each of the plurality of first conductive layers;
a contact disposed in the staircase portion and connected to one first conductive layer out of the plurality of first conductive layers;
a second insulating layer covering the staircase portion at least up to a height of an uppermost layer of the stacked body; and
a first layer disposed in the second insulating layer along a shape of the staircase portion, the first layer being of a type different from a type of at least the second insulating layer,
wherein:
the contact includes a second conductive layer extending from above the staircase portion to the one first conductive layer, the second conductive layer being integrated with the one first conductive layer,
the contact includes a liner layer covering a side wall of the second conductive layer and extending to at least a position below the first layer,
the contact includes a metal-containing insulating layer interposed between the second conductive layer and the liner layer, the metal-containing insulating layer extending on an inner side of the second insulating layer in the stacking direction,
the metal-containing insulating layer penetrates the second insulating layer below the first layer,
the metal-containing insulating layer continuously extends from a side wall of the second conductive layer to an upper surface of the one first conductive layer excluding a connection surface with the contact,
the contact includes a third conductive layer interposed between the second conductive layer and the metal-containing insulating layer and extending on the inner side of the second insulating layer in the stacking direction, and
the third conductive layer penetrates the second insulating layer below the first layer.

2. The semiconductor memory device according to claim 1, wherein the liner layer is a layer having selectivity in dry etching against the first layer.

3. The semiconductor memory device according to claim 2, wherein the liner layer is a fourth insulating layer of a same type as the second insulating layer.

4. The semiconductor memory device according to claim 1, wherein the liner layer is a layer having selectivity in wet etching against the second insulating layer.

5. The semiconductor memory device according to claim 4 wherein the liner layer is a fourth conductive layer containing metal.

6. The semiconductor memory device according to claim 1, wherein the third conductive layer continuously extends on an inner side of the metal-containing insulating layer from a side wall of the second conductive layer to the upper surface of the one first conductive layer excluding the connection surface with the contact.

* * * * *